United States Patent [19]

Lilienthal

[11] 4,357,645
[45] Nov. 2, 1982

[54] SYSTEM FOR DETECTING FAULTY SCR'S

[75] Inventor: Clarence D. Lilienthal, Eden Prairie, Minn.

[73] Assignee: Control Concepts Inc., Minnetonka, Minn.

[21] Appl. No.: 263,153

[22] Filed: May 13, 1981

[51] Int. Cl.³ .............................................. H02H 3/08
[52] U.S. Cl. ..................................... 361/93; 323/243
[58] Field of Search .................... 361/18, 93; 323/242, 323/243, 272, 244, 276, 277

[56] References Cited

U.S. PATENT DOCUMENTS

| | | |
|---|---|---|
| 3,206,675 | 9/1965 | Brunetto . |
| 3,548,289 | 12/1970 | Liska et al. ............................ 323/242 |
| 3,679,970 | 7/1972 | Winters et al. . |
| 4,031,465 | 6/1977 | Sterner . |
| 4,056,776 | 11/1977 | Olsson et al. . |
| 4,142,151 | 2/1979 | Hansen . |
| 4,156,189 | 5/1979 | Genuit et al. . |
| 4,167,698 | 9/1979 | Podlewski . |

FOREIGN PATENT DOCUMENTS 52-68948  6/1977  Japan ................................. 323/243

Primary Examiner—Harry E. Moose, Jr.
Attorney, Agent, or Firm—Orrin M. Haugen; Thomas J. Nikolai

[57] ABSTRACT

A safety circuit for a silicon controlled rectifier controller of the type wherein the current delivered to a load is determined by controlling the firing angle of the silicon controlled rectifiers. The safety circuit is capable of sensing a shorted condition in the silicon controlled rectifiers and automatically disconnecting the load from the AC mains in the event of such a short circuit condition. Load current is sampled at a time in the cycle where it is expected to be zero. If at the sampling time a non-zero condition is detected, a relay is made to operate to actuate a circuit breaker or to perform other desired functions.

4 Claims, 3 Drawing Figures

SYSTEM FOR DETECTING FAULTY SCR'S

BACKGROUND OF THE INVENTION

I. Field of the Invention:

This invention relates generally to a protection circuit for electrical apparatus and more particularly to a system for detecting when silicon controlled rectifier (SCR) control elements, in solid-state power supply equipment have failed in a shortened circuit.

II. Discussion of the Prior Art:

Since the introduction of the SCR's as high power current switching devices, they have found wide application in solid-state control systems where it is desired to control the current, voltage and/or power supplied to a load. Typically, in single or multi-phase systems, one or more pairs of SCR's may be connected in a back-to-back relationship and in series with a load to which the current, voltage or power is to be controlled and across the AC supply mains. Suitable control means are provided for triggering the SCR's into conduction at an appropiate time in the positive and negative half cycles of the alternating current supply. The time between the zero crossing of the AC supply waveform and the moment that the SCR's are driven into conduction is commonly termed the "firing angle". By providing means whereby the firing angle can be adjusted, the power, current, and/or voltage delivered to the load is controllable.

Various open-loop and closed-loop control devices are known in the art for accurately determining the point in the applied AC waveform where triggering of the SCR's is to occur. In these devices, however, no protection is afforded to the load device in the event that one or more of the SCR's should fail in a shorted condition. When a short-type failure occurs, of course, the current delivered to the load is no longer controlled and is limited solely by the voltage source and the impedance of the load connected to the source. A sustained flow of current to the load through the entire AC cycle can result in damage to the equipment being controlled.

In view of the above, it is advantageous to provide in a switched SCR controller a protective circuit which has the capability of detecting the shortened SCR condition and for disconnecting the load from the supply mains when such a short condition is detected.

SUMMARY OF THE INVENTION

In accordance with the present invention, means are provided for sampling the amplitude of the current flowing at a point in the circuit and at a time in the cycle where the firing angle controller is dictating that the load current should be some known, fixed level, such as, for example, zero. If at this sampling time the load current flowing is other than zero, it is known that one or more of the SCR's employed in the control system have failed in a shorted mode and a suitable signal is developed for tripping a circuit breaker whereby the AC mains are disconnected from the series coupled SCR arrangement and the load.

In the preferred embodiment, a ramp signal synchronized with the frequency of the AC supply is applied as a first input to a comparator. The second input to the comparator is proportional to the set-point voltage. The output from the comparator is coupled through a toggle circuit to the gate electrodes of the SCR's such that changes in the set point value result in the triggering signal being applied to the gate electrodes earlier or later in the cycle. Disposed in the lines leading to the load is a current monitoring device such as a current transformer which is effective to monitor the amplitude of the current flowing through the load. The output from the current transformer is suitably shaped into a CMOS compatible signal and applied to the data input terminal of a D-type flip-flop. The clock input for the flip-flop is effectively coupled to the output from the aforementioned comparator and causes the flip-flop to be clocked on each half-cycle at a time prior to the triggering of the appropriate SCR. Only if a load current is detected by way of the current monitoring device at the clocking time will the control flip-flop be conditioned to output a signal for activating the circuit breaker.

OBJECTS

Accordingly, it is a principal object of the present invention to provide a new and improved safety circuit for a SCR-type load current/power controller.

Another object of the invention is to provide in a SCR-type load current/power controller an apparatus for detecting the existence of a shorted SCR and for producing a control signal for disconnecting the alternating current source from the load.

Another object of the invention is to provide in a SCR-type current/power controller a circuit for sensing the existence of load current at a time when there should be none and for signaling the event to a utilization device.

These and other objects and advantages of the invention will become apparent to those skilled in the art from the following detailed description of a preferred embodiment, especially when considered in conjunction with the accompanying drawings in which:

DESCRIPTION OF THE DRAWINGS

FIG. 3 is a schematic diagram of the toggle circuit of FIG. 1.

DESCRIPTION OF THE PREFERRED EMBODIMENT

Figure 1:
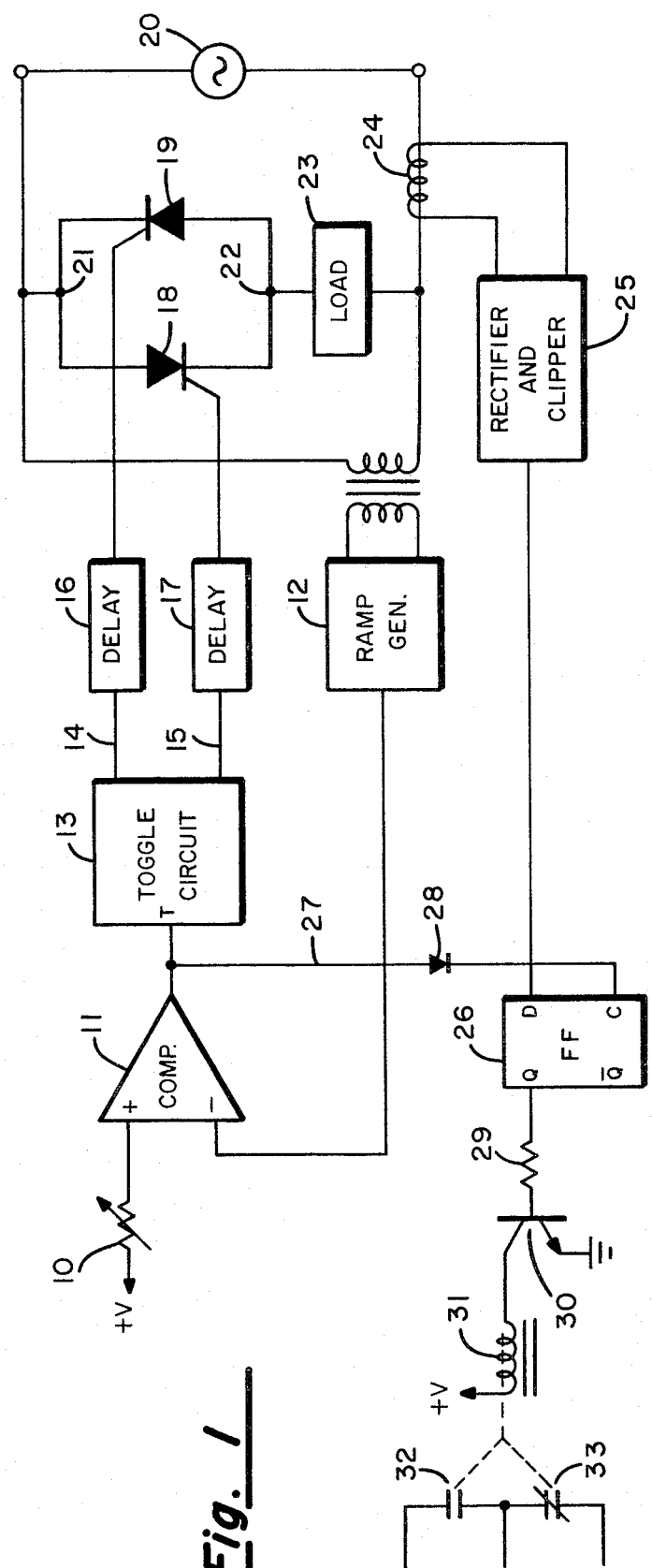
FIG. 1 illustrates by means of a block diagram a preferred implementation of the present invention.

Referring first to FIG. 1, there is illustrated by means of a schematic block diagram an electronic circuit whereby the principles of the present invention may be carried out. While the arrangement shown in FIG. 1 is illustrated as being applied to a single phase AC supply, those skilled in the art will readily appreciate how the inventive concept can be applied to a multi-phase power distribution system. The set-point potentiometer 10 is connected as a first input to an operational amplifier circuit 11 configured to function as a signal comparator. The second input to the comparator 11 comes from the output of a ramp signal generator 12. The output from the signal comparator 11 is coupled to a toggle circuit 13, this toggle circuit alternately providing the comparator output signal on lines 14 or 15 on successive half-cycles of the alternating current supply. More specifically, each time the sinusoidal waveform of the supply crosses the zero axis, the toggle circuit 13 switches states, allowing the comparator output to alternately appear on the toggle circuit output lines 14 and 15.

Delay elements 16 and 17 are disposed in the lines 14 and 15 and the output from the delay elements are coupled to the gate electrodes of the back-to-back configured SCR's 18 and 19. In a multi-phase system, a hybrid circuit including an SCR and an oppositely poled diode may be included in each branch of the supply instead of back-to-back connected SCR's. In doing so, the need for 2 N gate drive control circuits (one for each SCR) is obviated and only N such gate drive circuits are required. With continued reference to FIG. 1, one terminal of the alternating current supply 20 is connected to the common junction 21 between the anode electrode of SCR 18 and the cathode electrode of SCR 19. The common junction 22 is connected to one side of the load 23 whose load current is to be controlled and the remaining terminal of the load 23 is coupled through a current monitoring device, here shown as a current transformer 24, to the other side of the AC supply 20. Rather than using a current transformer as the current monitoring device, it is also feasible to use a Hall effect transducer or other device which will detect the presence of current in a circuit branch and provide a signal indicative of this fact.

The secondary winding of the current transformer is coupled to the input of a full wave rectifier and clipping network 25 and thus serves to provide at the output thereof a pulse-type signal when load current is flowing in through the load circuit 23.

The output terminal of the rectifier and clipper network 25 is connected to the data (D) input terminal of a D-type flip-flop 26. The clock input of this same flip-flop is coupled through the conductor 27 and diode 28 to the output from the signal comparator 11. It is, of course, possible to utilize a J-K type flip-flop rather than a D-type flip-flop.

The Q output from the flip-flop 26 is coupled through a resistor 29 to the base electrode of a NPN transistor 30 whose emitter electrode is tied to ground and whose collector electrode is coupled through the coil of a relay 31 to a suitable source of direct current potential, +V. The contacts of the relay 31 are identified by numerals 32 and 33. These contacts may be used to control the energization of a further circuit breaker (not shown) disposed in the AC supply mains or, alternatively, may be used to control an annunciator (not shown) of the shorted SCR condition.

Now that the details of the construction of the preferred embodiment have been set forth, consideration will be given to the mode of operation of the circuit and, in this regard, the waveforms of FIG. 2 will prove illustrative.

Figure 2:
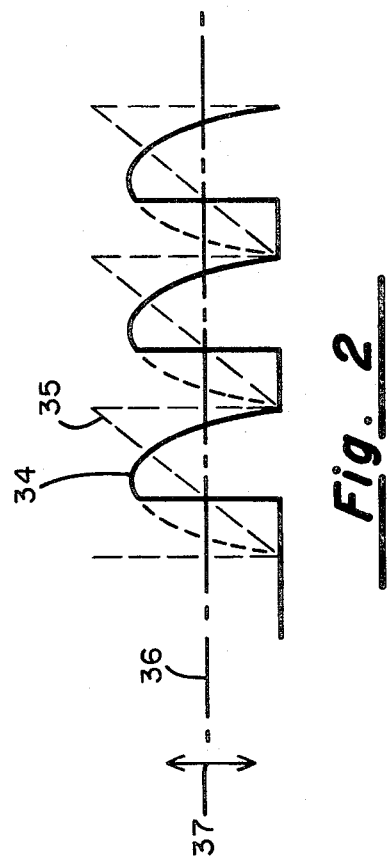
FIG. 2 illustrates waveforms helpful in understanding the operation of the system of FIG. 1.

With reference to FIG. 2, there is shown by the solid line waveform 34 the load current as controlled by properly functioning SCR devices. Superimposed upon this waveform and represented by the dashed line 35 is the ramp signal produced by the ramp signal generator 12 in FIG. 1. It is to be noted that at the zero crossing of the full-wave rectified AC current signal, the ramp signal drops to zero and then linearly rises to a predetermined amplitude before again dropping to zero at the termination of one half-cycle of the AC supply. This ramp signal is applied as a first input to the comparator 11 and the set point threshold established by the potentiometer 10 is coupled to the second input of the comparator. This threshold level is represented in FIG. 2 by the line 36. From FIG. 2, it is to be noted that when the ramp signal rises above the threshhold level established by the potentiometer 10, the comparator produces an output signal on either line 14 or line 15, depending upon the state of the toggle circuit 13. After undergoing a predetermined delay imposed by either the element 16 or 17, the signal reaches the gate electrode of either SCR 18 or SCR 19 so as to trigger it into conduction. Thus, the firing angle of the SCR controller is basically determined by the comparator 11 which functions to compare the ramp signal with the fixed set-point value. With continued reference to FIG. 2, the small double-ended arrow 37 is intended to illustrate the fact that the threshold level determined by the potentiometer 10 can be adjusted upward or downward. This, of course, results in the triggering of the SCR's later or earlier in the cycle.

It is apparent that prior to the turn-on of either of the SCR's 18 or 19, the current flowing through the load should be nominally zero. Again, assuming the SCR's are in proper operating condition, this signal output from the current transformer 24 should be zero prior to the time that the SCR's are triggered. Thus, there will be no output pulses from the rectifier and clipping network 25 applied to the D input of the flip-flop 26. Hence, at the time that the comparator 11 produces its output to clock the flip-flop 26, a low signal will be present at the Q output of the flip-flop and the transistor 30 will remain non-conducting.

Next assume that one or both of the SCR's 18 or 19 has failed in a shorted condition. If this is the case, a current will flow through the load circuit and will induce a voltage across the secondary of the current transformer 24. The rectifier and clipper network amplifies the sinusoidal signal so derived and through the clipping operation creates a rectangular pulse type waveform for application to the D input of the flip-flop 26. At the moment that the comparator 11 outputs its signal indicative that the ramp waveform has exceeded the threshold established by the potentiometer 10, the flip-flop 26 will be clocked and the voltage appearing at the output of the rectifier and clipper network 25 will be transferred to the Q output of the flip-flop. This positive voltage, when applied to the base electrode of the transistor 30 will drive it into conduction, allowing sufficient current to flow through the relay coil 31 to effect transfer of the relay contacts 32 and 33. Because of the delay elements 16 and 17, the clock signal will be applied to the flip-flop prior to the time that a triggering signal is applied to the back-to-back connected SCR's. Thus, at this time, the SCR's should be non-conducting. However, if one has failed in a shorted mode, a current will be detected at this time and an indication of the fact will result when the relay 31 pulls in. As has already been explained, the operation of the relay contacts 32 and 33 can be used to trigger a circuit breaker for disconnecting the load from the AC mains as well as to provide a suitable indication, via an annunciator panel (not shown), to apprise operating personnel of the faulty SCR condition.

While delay elements 16 and 17 are illustrated as discrete components in the diagram of FIG. 1, in practice these delays may be as a result of the inclusion of suitable switching circuitry disposed between the toggle circuit 13 and the gate electrodes of the SCR devices 18 and 19, those switching devices being of the type commonly used in firing angle control circuitry.

With reference to FIG. 3 the toggle circuit 13 may comprise a toggle-type flip-flop 38 arranged to drive gated amplifiers 39 and 40 to which the output of the comparator 11 is applied. Many forms of such flip-flops are commercially available. By coupling the toggling input thereof to a zero crossing detector 41 which, in turn, is coupled to the AC supply via a transformer 24 or other suitable device, the toggle circuit 13 is switched from one state to another at each zero crossing of the applied alternating current supply voltage to deliver an output signal from one or the other of the gated amplifiers.

The invention has been described herein in considerable detail, in order to comply with the Patent Statutes and to provide those skilled in the art with information needed to apply the novel principles, and to construct and use such specialized components as are required. However, it is to be understood that the invention can be carried out by specifically different equipment and devices, and that various modifications, both as to equipment details and operating procedures can be effected without departing from the scope of the invention itself.

What is claimed is:

1. In a load current controller of the type in which triggerable semiconductor current control elements are disposed in series relation between an alternating current source and a load and having means for adjusting the firing angle of said semiconductor current control elements, apparatus for sensing a short circuit failure of said semiconductor current control elements, comprising:
   (a) means for sensing the level of current flowing from said source of alternating current through said load; and
   (b) means coupled to said sensing means for signaling the existence of a predetermined non-zero current in the load at a time in the alternating current cycle prior to the triggering of said semiconductor current control elements when no load current should be present.

2. A load current controller apparatus, comprising:
   (a) at least one silicon controlled rectifier, having an anode electrode, a cathode electrode and a gate electrode, said anode and cathode electrodes adapted to be connected in series between alternating current supply terminals and a load whose current is to be controlled;
   (b) means adapted to be coupled to said alternating current supply terminals for generating a ramp voltage signal synchronized with the alternating current supply;
   (c) means for comparing said ramp voltage signal to a predetermined set-point reference voltage, said comparing means providing an output voltage when the ramp voltage exceeds said set-point reference voltage;
   (d) toggling means for successively and alternately coupling said comparator output voltage to said gate electrode of said silicon controlled rectifier;
   (e) means for sensing the level of current flowing through the load; and
   (f) means coupled to said sensing means for indicating the existence of load current prior to the instant that said comparator output voltage is produced.

3. Apparatus as in claim 2 wherein said means for sensing the level of load current flowing through said load comprises:
   (a) current responsive means adapted to be operatively coupled between said alternating current source terminals and said load;
   (b) a bistable circuit having a first input, a second input coupled to the output of said comparing means, and an output terminal; and
   (c) means coupling said current responsive means to said first input of said bistable circuit.

4. Apparatus as in claim 2 wherein said toggling means comprises:
   (a) first and second gated amplifiers, each having a signal input, an enable input and an output;
   (b) means coupling the output voltage of said comparing means to said signal input of each of said gated amplifiers;
   (c) a toggle flip-flop having a toggle input terminal and true and complement output terminals;
   (d) means coupling said toggle input terminal to a source of toggling pulses; and
   (e) means coupling the enable input of said first and second gated amplifiers to said true and complement output terminals of said toggle flip-flop, respectively.

* * * * *